United States Patent
Yamamoto

(10) Patent No.: US 8,198,108 B2
(45) Date of Patent: Jun. 12, 2012

(54) SEMICONDUCTOR DEVICE AND METHOD FOR MANUFACTURING THE SAME

(75) Inventor: Saiki Yamamoto, Anan (JP)

(73) Assignee: Nichia Corporation, Anan-shi (JP)

( * ) Notice: Subject to any disclaimer, the term of this patent is extended or adjusted under 35 U.S.C. 154(b) by 4 days.

(21) Appl. No.: 12/905,353

(22) Filed: Oct. 15, 2010

(65) Prior Publication Data
US 2011/0070673 A1      Mar. 24, 2011

Related U.S. Application Data

(62) Division of application No. 11/700,201, filed on Jan. 31, 2007, now Pat. No. 7,859,004.

(30) Foreign Application Priority Data

Feb. 1, 2006   (JP) .................................. P2006-24707

(51) Int. Cl.
*H01L 21/60*      (2006.01)
(52) U.S. Cl. .......... 438/26; 438/111; 438/123; 438/973; 257/E33.058; 257/E21.5
(58) Field of Classification Search .................... 438/26, 438/111, 123, 973; 257/E33.058, E21.5
See application file for complete search history.

(56) References Cited

U.S. PATENT DOCUMENTS

| | | | |
|---|---|---|---|
| 6,433,418 B1 * | 8/2002 | Fujisawa et al. | ............... 257/696 |
| D497,349 S | 10/2004 | Hoshiba | |
| 8,013,357 B2 * | 9/2011 | Park et al. | ........................ 257/99 |
| 2004/0046242 A1 | 3/2004 | Asakawa | |
| 2004/0155365 A1 * | 8/2004 | Ochiai et al. | ................... 257/791 |
| 2005/0168957 A1 | 8/2005 | Kawauchi et al. | |

(Continued)

FOREIGN PATENT DOCUMENTS

JP          2004-363537 A      12/2004

(Continued)

OTHER PUBLICATIONS

Advisory Action dated Oct. 6, 2009 for U.S. Appl. No. 11/700,201.

(Continued)

*Primary Examiner* — George Fourson, III
(74) *Attorney, Agent, or Firm* — Birch, Stewart, Kolasch & Birch, LLP.

(57) ABSTRACT

The semiconductor device 1 comprises a housing 12 which has a recess 24 in the front surface 1; a pair of lead electrodes 20 which have the distal ends 34 exposed in the recess 24, protrude from the external surface of the housing 12, and are bent along the bottom surface 16 of the housing 12; and a semiconductor element 36 which is housed in the recess 24 and is electrically connected to the pair of lead electrodes 20. The housing 12 has grooves 30 which are formed on the pair of side surfaces 18 which adjoin the front surface 14 and the bottom surface 16 on the right and left sides so as to penetrate the housing 12 from the top surface 28 toward the bottom surface 16 of the housing 12. The grooves 30 preferably have width substantially equal to the thickness of the lead electrode 20. The grooves 30 are more preferably formed to be flush with the distal ends 34 of the lead electrode 20.

15 Claims, 10 Drawing Sheets

U.S. PATENT DOCUMENTS

| | | | |
|---|---|---|---|
| 2006/0098923 | A1 | 5/2006 | Fujiwara et al. |
| 2006/0151793 | A1 | 7/2006 | Nagai |
| 2007/0183159 | A1 | 8/2007 | Maeta et al. |
| 2007/0187709 | A1* | 8/2007 | Yamamoto ............ 257/99 |
| 2008/0089072 | A1* | 4/2008 | Kim et al. ............ 362/294 |
| 2008/0200048 | A1* | 8/2008 | Matsuura et al. ............ 439/78 |
| 2010/0014269 | A1* | 1/2010 | Essert et al. ............ 361/813 |
| 2011/0070673 | A1* | 3/2011 | Yamamoto ............ 438/26 |

FOREIGN PATENT DOCUMENTS

| | | |
|---|---|---|
| JP | 2005-217284 A | 8/2005 |
| JP | 2006-19313 A | 1/2006 |
| WO | WO 2004/097480 A1 | 11/2004 |

OTHER PUBLICATIONS

Final Office Action dated Aug. 7, 2009 for U.S. Appl. No. 11/700,201.

Non-Final Office Action dated Feb. 10, 2009 for U.S. Appl. No. 11/700,201.

Non-Final Office Action dated Mar. 1, 2010 for U.S. Appl. No. 11/700,201.

Notice of Allowance dated Aug. 9, 2010 for U.S. Appl. No. 11/700,201.

Restriction Requirement dated Sep. 30, 2008 for U.S. Appl. No. 11/700,201.

* cited by examiner (A)

(B)

(A)

(B)

(A)

(B)

(C)

(A)

(B)

(A)

(B)

SEMICONDUCTOR DEVICE AND METHOD FOR MANUFACTURING THE SAME

This application is a Divisional of application Ser. No. 11/700,201, filed on Jan. 31, 2007 now U.S. Pat. No. 7,859,004, the entire contents of which are hereby incorporated by reference and for which priority is claimed under 35 U.S.C. §120.

BACKGROUND OF THE INVENTION

1. Field of the Invention

The present invention relates a light emitting device using a semiconductor light emitting element, and a light receiving device used in an optical sensor or the like, and, more particularly, to a low-profile light emitting device used as the backlight of a liquid crystal display.

2. Description of the Related Art

In recent years, the backlight of a liquid crystal display employs a surface-emitting light source comprising a low-profile light emitting device and an optical guide which spreads the light emitted by the light emitting device. One among the light emitting devices used in such applications is a low-profile light emitting device comprising a light emitting diode disposed in a flat housing made of a resin (refer to, for example, Japanese Unexamined Patent Publication (Kokai) No. 2004-363537). The resin housing has such a constitution as a protrusion is provided on an elongated light emitting surface and a recess which receives the protrusion is formed on the end face of the optical guide, so as to improve the precision of positioning with respect to the optical guide.

Japanese Unexamined Patent Publication (Kokai) No. 2004-363537 discloses such a constitution as a hanger lead is provided in a part of a lead frame, so as to support the housing on the lead frame during the process of manufacturing the light emitting device. A method of supporting the housing by using a typical hanger lead will be described below with reference to the accompanying drawing.

FIG. 10(A) shows an example of lead frame 102 having a housing 106. Supported on the lead frame 102 by the hanger lead 100 is the housing 106 which has a flat shape and incorporates a pair of lead electrodes 104. FIG. 10(B) is a partially enlarged view of the structure of supporting the housing 106 by the hanger lead 100. As can be seen from this drawing, a distal end 108 of the hanger lead 100 is embedded in a side surface 110 of the housing 106. The housing 106 is supported on the lead frame 102, by forming the support structure comprising the housing 106 and the hanger lead 100 on the side surfaces 110 on both sides of the housing 106. The housing 106 is supported in such a manner as the principal surface thereof is disposed at right angles to the front surface of the lead frame 102.

FIGS. 11(A) and 11(B) are perspective views of a light emitting device constituted from the lead frame 102 provided with the housing 106 shown in FIGS. 10(A) and 10(B). A method of forming the light emitting device 114 shown in FIG. 11 from the lead frame 102 provided with the housing 106 shown in FIGS. 10(A) and 10(B) will now be described.

First, an LED is mounted in a recess 112 of the housing 106. As distal end portions of a pair of lead electrodes 104 are exposed in the recess 112, electrical continuity is established in advance between the two distal end portions and positive or negative electrode of the LED, respectively, by die bonding or wire bonding. The recess 112 is filled with a translucent resin so as to seal the LED with the resin 116 in the housing 106. Then the lead frame 102 is cut off along dashed line X. The lead electrode 104 which is cut off the lead frame 102 is bent along the bottom surface of the housing 106 and is further bent along the side surface. During the bending operation, the housing 106 is held in a predetermined posture by the hanger lead 100. Last, the hanger lead 100 is bent in the state of supporting the housing 106, and the hanger lead 100 is pulled out of the side surface 110 of the housing 106, thereby obtaining the light emitting device 114. As a result, the depression 118 in which the distal end portions 108 of the hanger lead 100 were embedded is left to remain in the side surfaces 110 of the light emitting device 114 as shown in FIGS. 11(A) and 11(B). The low-profile light emitting device 114 manufactured in this way is mounted with the side of the lead electrode 104 facing downward. The light emitting device 114 is combined with an optical guide with the side of the recess 112 serving as the window for light emission, so as to constitute a surface emitting light source for liquid crystal display of mobile phone or mobile computer.

While the light emitting device disclosed in Japanese Unexamined Patent Publication (Kokai) No. 2004-363537 has a thickness small enough to suit the application to plane light source, recently there is a demand for light emitting device of further smaller thickness. However, decreasing the thickness of the light emitting device having the constitution disclosed in Japanese Unexamined Patent Publication (Kokai) No. 2004-363537 gives rise to some problems.

For example, when a low-profile light emitting device is manufactured by using lead frame provided with hanger lead, it is necessary to decrease the width of the hanger lead which results in a decrease in strength of the hanger lead. This increases the possibility of such troubles to occur as the hanger lead is subjected to torsional deformation when the lead frame provided with hanger lead is transported, thus causing the housing to tilt. Also during the operation to bend the lead electrode 104, stress acting on the housing 106 causes the hanger lead 100 to twist, thus resulting in tilting of the housing 106. Tilting of the housing makes it impossible to die-bond the semiconductor element, thus giving rise to the possibility of faulty products.

The low-profile light emitting device is prone to troubles during positioning also in case it is mounted by a conventional chip mounter. A chip mounter which is commonly used has a suction nozzle for transferring the chip. The light emitting device is held on the top surface thereof by the suction nozzle by means of negative pressure, and is transferred to the mounting position. The light emitting device transferred by the suction nozzle is precisely positioned at the predetermined position of a sub-mount, and is placed at the predetermined position by breaking the vacuum in the suction nozzle. However, in case the semiconductor device is thinner and lighter in weight than the conventional one, position of the semiconductor device may be displaced by a slight movement of air caused by breaking the vacuum, even when the semiconductor device and the sub-mount are aligned precisely before breaking the vacuum of the suction nozzle.

SUMMARY OF THE INVENTION

Accordingly, an object of the present invention is to provide a semiconductor device of a structure suitable for reduction in thickness and in weight, particularly to provide a semiconductor device which allows it to (1) stably hold the housing which is secured onto the lead frame during the manufacturing process, and (2) improve the positioning accuracy when mounting the product thus manufactured.

The present invention is a semiconductor device comprising a housing which has a recess in the front surface thereof, a pair of lead electrodes which have distal ends exposed in the recess, protrude from the external surface of the housing and are bent along the bottom surface of the housing, and a semiconductor element which is housed in the recess and is electrically connected to the pair of lead electrodes, wherein the housing has grooves which penetrate the housing from the top surface toward the bottom surface of the housing and are formed on the pair of side surfaces adjoining the front surface and the bottom surface on right and left sides thereof.

The grooves of the semiconductor device preferably have width substantially equal to the thickness of the lead electrode.

It is further preferable that the grooves are formed flush with the distal end of the lead electrode.

The present invention is a method for manufacturing a light emitting device which comprises a housing having a recess in the front surface thereof, a pair of lead electrodes which have distal ends exposed in the recess, protrude from the external surface of the housing and are bent along the bottom surface of the housing, and a semiconductor element which is housed in the recess and is electrically connected to the pair of lead electrodes, the method comprising the steps of preparing the lead frame constituted from a metal sheet having a plurality of openings and a pattern of the lead frame formed therein so as to protrude toward the inside of each of the openings, exposing the distal ends of the lead electrode in the recess of the housing and forming the grooves in the side surfaces of the housing by means of circumference of the opening formed in the lead frame, bending the pair of lead electrodes, which protrude from the housing, along the external wall surface of the housing while holding the housing on the lead frame by cutting off the pair of lead electrodes from the lead frame and fitting the opening formed in the lead frame into the groove, and releasing the housing from the lead frame.

With the semiconductor device of the present invention, it is made possible to improve the accuracy of positioning during mounting, too, by taking advantage of the grooves formed in the side surfaces of the housing so as to penetrate therethrough. When a guide bar which fits in the groove is provided on the suction nozzle of the chip mounter which transfers the semiconductor device, for example, displacement of the semiconductor device caused by breaking the vacuum after the transfer of the semiconductor device can be suppressed. A guide pin which fits into the groove may also be provided on the circuit board whereon the device is to be mounted. Since the groove penetrates from the top through the bottom, the guide bar or the guide pin can be easily inserted and pulled out either from the top or the bottom. The guide bar and the guide pin may have simple rod shape. In case the light emitting device is used in combination with an optical component such as optical guide, for example, the light emitting device and the optical component can be easily positioned by providing a positioning member at a predetermined position of the optical component which fits into the groove of the light emitting device.

With the semiconductor device described above, in case the groove has a width substantially equal to the thickness of the lead electrode, there may be a case of supporting the housing by fitting a part of the lead frame into the groove. Since the groove penetrates from the top through the bottom, the housing can be engaged with the circumference of the opening formed in the lead frame which has higher strength, not on a hanger lead of thin band shape as in the prior art. This enables it to suppress the housing which is secured onto the lead frame from tilting, even when the light emitting device is made thinner. At this time, the circumference of the opening may be processed so as to match the groove. In case the groove is not formed flush with the lead frame, for example, the circumference of the opening may be adjusted in shape so as to achieve the same height as the groove.

It is more preferable to form the groove of the housing flush with distal end of the lead electrode, namely in the same surface as the main body of the lead frame before cutting off the housing, since this eliminates the need to process the circumference of the opening formed in the lead frame as described above. The housing can be held directly onto the lead frame by fitting an appropriate portion of the circumference of the opening formed in the lead frame into the groove without processing.

According to the method of manufacturing a semiconductor device of the present invention, the housing is secured onto the circumference of the opening formed in the lead frame for manufacturing the semiconductor described above, and therefore the housing can be suppressed from tilting during the manufacturing process. As the portion which has been holding the lead frame interposed therebetween remains as the groove in the semiconductor device thus obtained, the groove can be used to prevent displacement during mounting and help alignment with the optical component. Thus the manufacturing method of the present invention makes it possible to prevent the housing secured onto the lead frame from tilting and causing defects, and manufacture the semiconductor device which can be easily mounted.

DESCRIPTION OF REFERENCE NUMERALS

Figure 1:
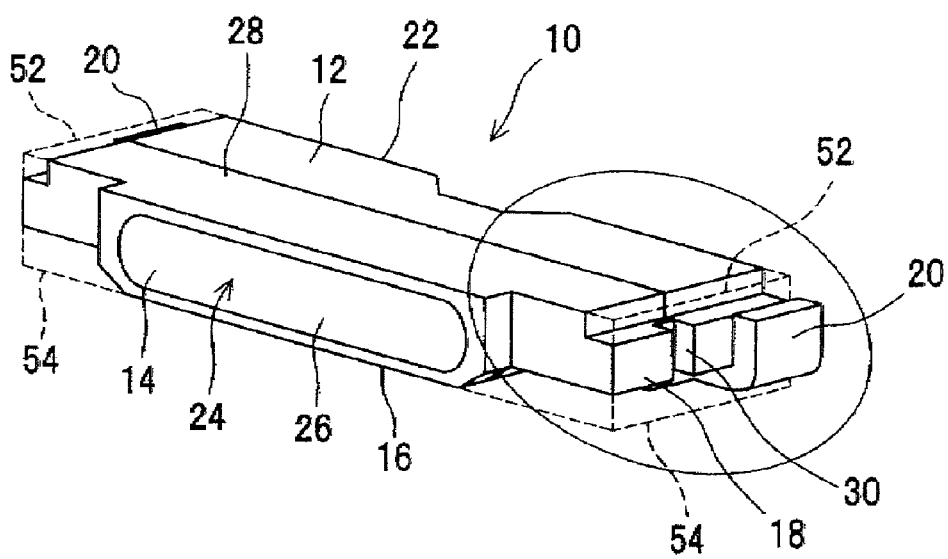
FIG. 1(A) is a perspective view schematically showing the light emitting device of the present invention.
FIG. 1(B) is a partially enlarged view of a part of (A).
Figure 1:
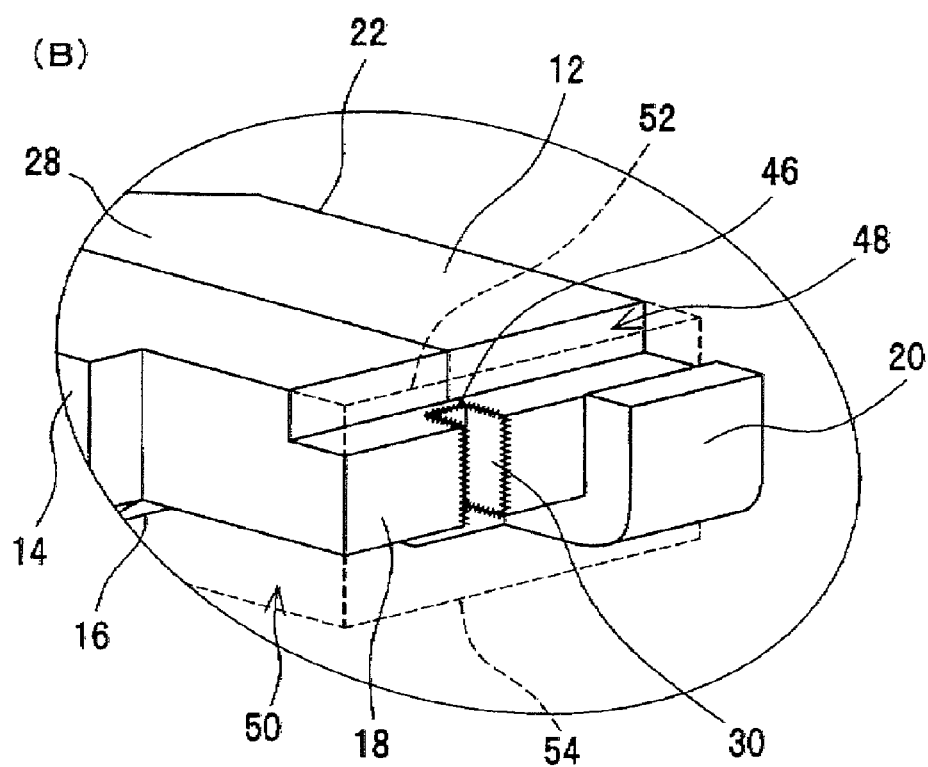

10 Semiconductor device
12 Housing

14 Front surface of housing
16 Bottom surface of housing
18 Side surface of housing
20 Lead electrode
22 Back surface
24 Recess of housing
28 Top surface of housing
30 Groove
32 Lead frame
34 Distal ends (a, b) of lead electrode
36 Semiconductor element
40 Opening
42 Circumference of opening
48 Notch
50 Step
52 Corner (Edge on top surface side)
54 Corner (Edge on bottom surface side)

DESCRIPTION OF THE PREFERRED
EMBODIMENTS

The light emitting device 10 shown in FIG. 1 comprises a housing 12 of flat shape and a lead electrode 20 which is bent from a bottom surface 16 along a side surface 18 of the housing 12. Front surface of the housing 12 serves as a light emitting surface 14, with a recess 24 formed so as to open in the light emitting surface 14 and extends toward the back surface 22. The opening of the recess 24 constitutes a window for light emission. The recess 24 is filled with a translucent resin 26 so as to seal a semiconductor light emitting element (not shown) which is mounted in the recess 24. A groove 30 is formed in the side surface 18 of the housing 12 to extend in parallel to the light emitting surface 14. The groove 30 penetrates from the top surface 28 through the bottom surface 16 of the housing 12. The housing 12 serves as a support member which supports a semiconductor light emitting device and the distal end of the lead electrode 20, and also as a protective member which protects the semiconductor light emitting element and the metal wire used in wire bonding from the external environment.

In this specification, the expression of "housing of flat shape" means that the housing has a height smaller in comparison to width and depth thereof.

The groove 30 is formed flush with the lead electrode 20 which is provided in the recess 24, as will be described in detail later, and the groove 30 has a width substantially equal to the thickness of the lead electrode 20. Therefore in the process of manufacturing the light emitting device 10, the groove serves as a holding member which holds the portion which surrounds the opening formed in the lead frame, namely the circumference of the opening (referred to as opening circumference in the present specification), so as to secure the housing 12 with respect to the lead frame. As a result, the housing can be suppressed from tilting when transferring the lead frame provided with the housing and when cutting and forming the lead frame.

The groove 30 can be used in positioning when mounting the light emitting device by inserting a guide bar or a guide pin into the groove 30. Since the groove 30 penetrates from the top through the bottom, the guide bar or the guide pin can be easily inserted and pulled out either from the top or the bottom of the housing 12. Since the groove 30 opens also in the side surface 18, such a guide member that enters into the groove 30 through the side surface 18 can be used, in addition to a rod-shaped guide member such as the guide bar or the guide pin. Thus positioning can be done by means of guide members of various forms, since the light emitting device 10 has the groove 30 which penetrates therethrough. Various methods of positioning will be described below as examples.

Figure 2:
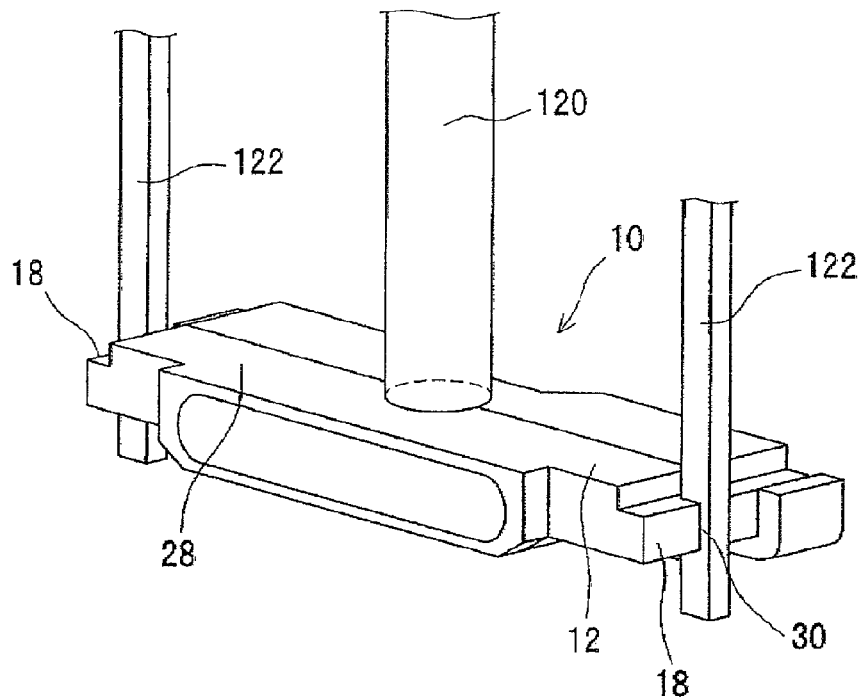
FIG. 2 is a perspective view schematically showing the light emitting device of the present invention being transferred by a chip mounter.

FIG. 2 shows an example of the process of mounting the light emitting device 10 by means of the chip mounter. The suction nozzle 120 sucks up the housing 12 of the light emitting device 10 on the top surface 28 thereof, while two guide bars 122 supported by the chip mounter are inserted into the grooves 30 formed in the side surfaces 18 on both sides of the housing 12. When the guide bars 122 are inserted into the grooves 30, the light emitting device 10 can be moved up and down sliding along the guide bar 122.

With the light emitting device 10 being guided by the guide bars 122 and positioned at a predetermined position of the sub-mount, breaking the vacuum in the suction nozzle 120 does not cause the light emitting device 10 to be displaced over the surface due to the guide bar, and being capable of sliding up and down so as to settle on the sub-mount. As a result, displacement does not occur when vacuum is broken, even when the light emitting device 10 is made with smaller weight and smaller thickness.

Figure 3:
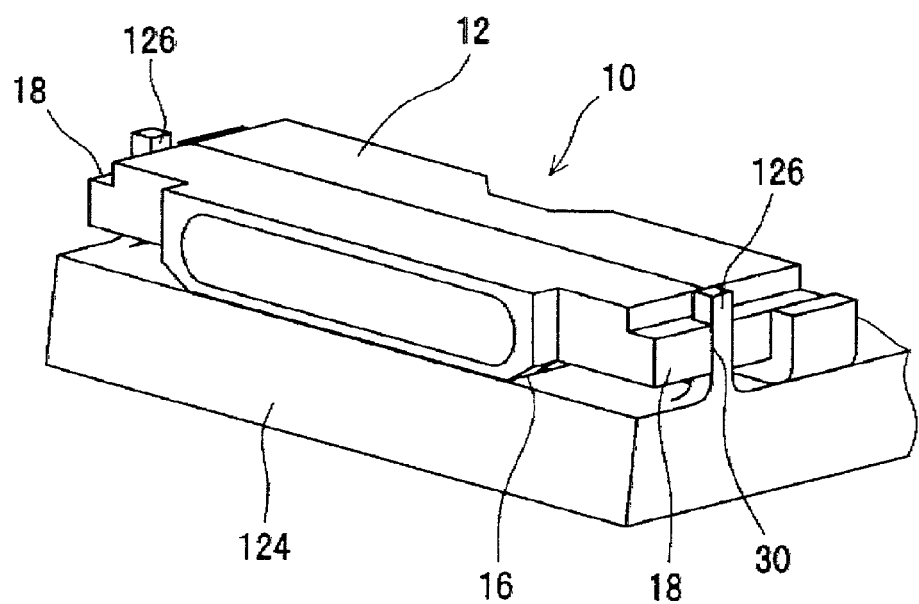
FIG. 3 is a perspective view schematically showing the light emitting device of the present invention mounted on a sub-mount.

FIG. 3 shows an example of mounting of the light emitting device 10 on the sub-mount 124. The sub-mount 124 has a guide pin 126 at a position corresponding to the position where the light emitting device 10 is mounted. The light emitting device 10 can be prevented from being displaced from the predetermined position over the surface or tilting from the predetermined direction, by fitting the two guide pins 126 in the grooves 30 formed in the side surfaces 18 located on the right and left of the light emitting device 10.

Since the groove 30 penetrates the housing 12, the groove 30 and the guide pin 126 can be easily fitted together. That is, after transferring the light emitting device 10 to a position above the sub-mount 124, it suffices to align the bottom end of the groove 30 and the top end of the guide pin 126 and lowering the light emitting device 10 vertically toward the sub-mount 124.

Figure 4:
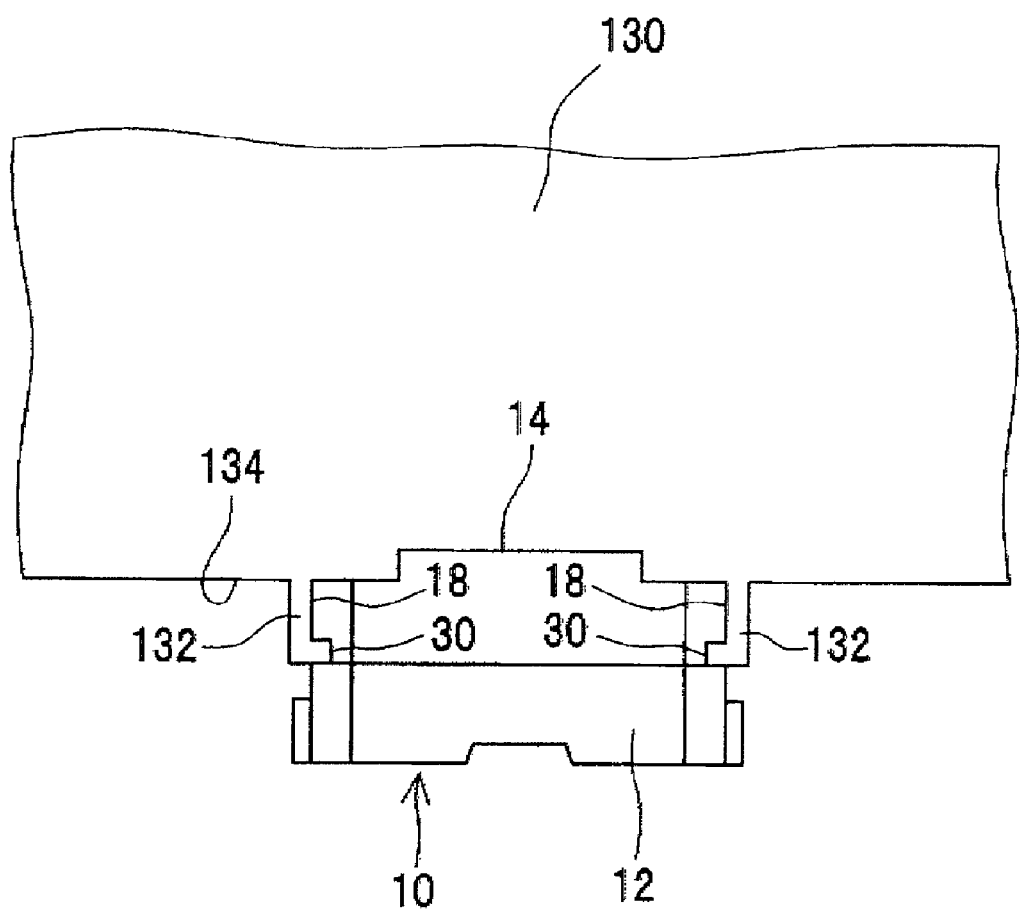
FIG. 4 is a top view schematically showing a surface emitting light source which combines the light emitting device of the present invention and an optical guide.

FIG. 4 shows an example of surface emitting light source which combines the light emitting device 10 and an optical guide 130. The optical guide 130 has two hooks 132 on the end 134. The hooks 132 are formed so as to lock onto the grooves 30 formed in the side surfaces 18 of the housing 12, thus enabling it to achieve accurate relative positioning of the light emitting device 10 and an optical guide 130.

Since the groove 30 penetrates the housing, the light emitting device 10 can be positioned easily and accurately simply by aligning the grooves 30 and the hooks 132 and inserting the light emitting device 10 between the two hooks 132.

In FIG. 1, it is preferable to form notches or steps in a pair of corners (ridges on top surface side) 52 where the top surface 28 and the side surfaces 18 of the housing 12 intersect, so that the top end of the groove 30 is located below the top surface 28 of the housing 12.

The grooves 30 formed in the side surfaces 18 of the housing 12 are formed at the same time as the housing 12 is molded. At this time, small burrs 46 tend to be formed on the edges of the groove 30. In case the end of the groove 30 is flush with the top surface 28 of the housing 12, the burrs 46 increase the thickness of the housing 12, and therefore increase the thickness of the light emitting device 10. In the case of a low-profile light emitting device, in particular, it is not desirable that the thickness increases due to the burrs 46. While the burrs 46 may be removed after being generated, it is not desirable since it increases the manufacturing process. When notches or steps (notches 48 are shown in FIG. 1) are formed in the ridges 52 on top surface side so that the burrs generated on the top end of the groove 30 do not protrude beyond the top surface 28, and therefore it is made possible to prevent the height of the light emitting device from increasing due to the burrs 46 generated on the top end of the groove 30 after the molding process.

It is preferable to form the notches or steps in the pair of corners (ridges on bottom surface side) 54 where the bottom surface 16 and the side surfaces 18 of the housing intersect, so that the bottom end of the groove 30 is located above the bottom surface 16 of the housing 12. The light emitting device 10 of the present invention is mounted with the bottom surface 16 serving as the mounting surface. Therefore, when the burrs 46 generated on the bottom end of the groove 30 protrude beyond the bottom surface 16, not only the thickness of the light emitting device 10 increases but also the burrs 46 touch the mounting substrate and cause displacement in the mounting position of the light emitting device 10 and/or tilt the light emitting device 10. By providing the notches or steps (steps are shown in FIG. 1) in the ridges on bottom surface side so that the burrs 46 generated on the bottom end of the groove 30 do not protrude beyond the bottom surface, it is made possible to prevent such problems from occurring as displacement of the mounting position of the light emitting device 10 when it is mounted on the circuit board.

As described above, the light emitting device of the present invention has a structure which can improve the mounting accuracy despite small thickness and small weight. As a result, use of the light emitting device in a thin surface emission light source makes it possible to maintain a high mounting accuracy comparable to that of the light emitting device of the prior art, even when the thickness of the housing of the semiconductor device of the present invention is decreased to 1.5 mm or less. The light emitting device of the present invention may also be formed in a shape suitable to a surface emission light source such that width of the housing is 3 times as the thickness thereof.

In the light emitting device 10 of the present invention, it is preferable to fill the recess 24 of the housing 12 with a translucent resin in which case the semiconductor light emitting element secured in the recess 24 of the housing 12 can be protected from the external environment. In case it is desired to emit light of a color different from that of the semiconductor light emitting element by means of the light emitting device 10, a fluorescent material may be mixed in the translucent resin so as to efficiently convert the wavelength.

The method of manufacturing the light emitting device 10 of the present invention will now be described with reference to FIGS. 5 to 9.

First, a metal sheet is punched through and is coated with metallic plating on the surface thereof, to make the lead frame 32. The lead frame 32 has a pair of lead electrodes 20 (20a and 20b), of which distal ends 34 (34a, 34b) oppose each other via a gap. Typically, a number of pairs of the lead electrodes 20 are formed on one metal sheet.

Then as shown in FIG. 5(A), the lead frame 32 is disposed between molding dies 70, 72 which are separated into upper and lower parts for molding the housing so as interpose the lead frame 32 between the upper and lower molding dies 70, 72. At this time, the distal ends 34 (34a, 34b) of the pair of lead electrodes 20 and a part of circumference 42 of the opening 40 formed in the lead frame 32 are disposed in a cavity 62 of the molding dies 70, 72 which has the shape of housing 12.

Then as shown in FIG. 5(B), a molding material 68 is poured into the cavity 62 of the molding dies 70, 72 through a material charging gate 64 of the lower molding die 72. The upper molding die 70 has a protrusion 66 corresponding to the recess 24 of the housing 12 formed thereon. When the molding material 68 is poured while the protrusion 66 is in contact with the top surface of distal end 34 of the lead electrode 20, it is made possible to keep the molding material from being deposited on the top surface of the distal end 34 and expose the distal end 34 on the inside of the recess 24 of the housing 12.

In this example, the distal ends 34 of the lead electrodes are completely exposed on the inside of the recess of the housing 12, however it is not necessary to completely expose these members. For example, a part of the lead electrode may be exposed in the recess by disposing the distal ends 34 of the lead electrodes directly below the bottom of the recess 24 (namely having the distal ends 34 of the lead electrodes covered by the molding material 68 of the housing 12) and forming a hole in the bottom of the recess 24. Then the light emitting device 10 of the present invention can be formed by establishing electrical continuity between the semiconductor light emitting element and the lead electrode through the hole.

When the molding material 68 has hardened in the molding dies 70, 72 as shown in FIG. 5(C), the lower molding die 72 is removed as shown in FIG. 5(D) and then the upper molding die 70 is removed. When the upper molding die 70 is removed, the housing 12 can be easily taken out by pushing out release pins 60, which are inserted slidably into the upper molding die 70, in the direction of P.

Figure 5:
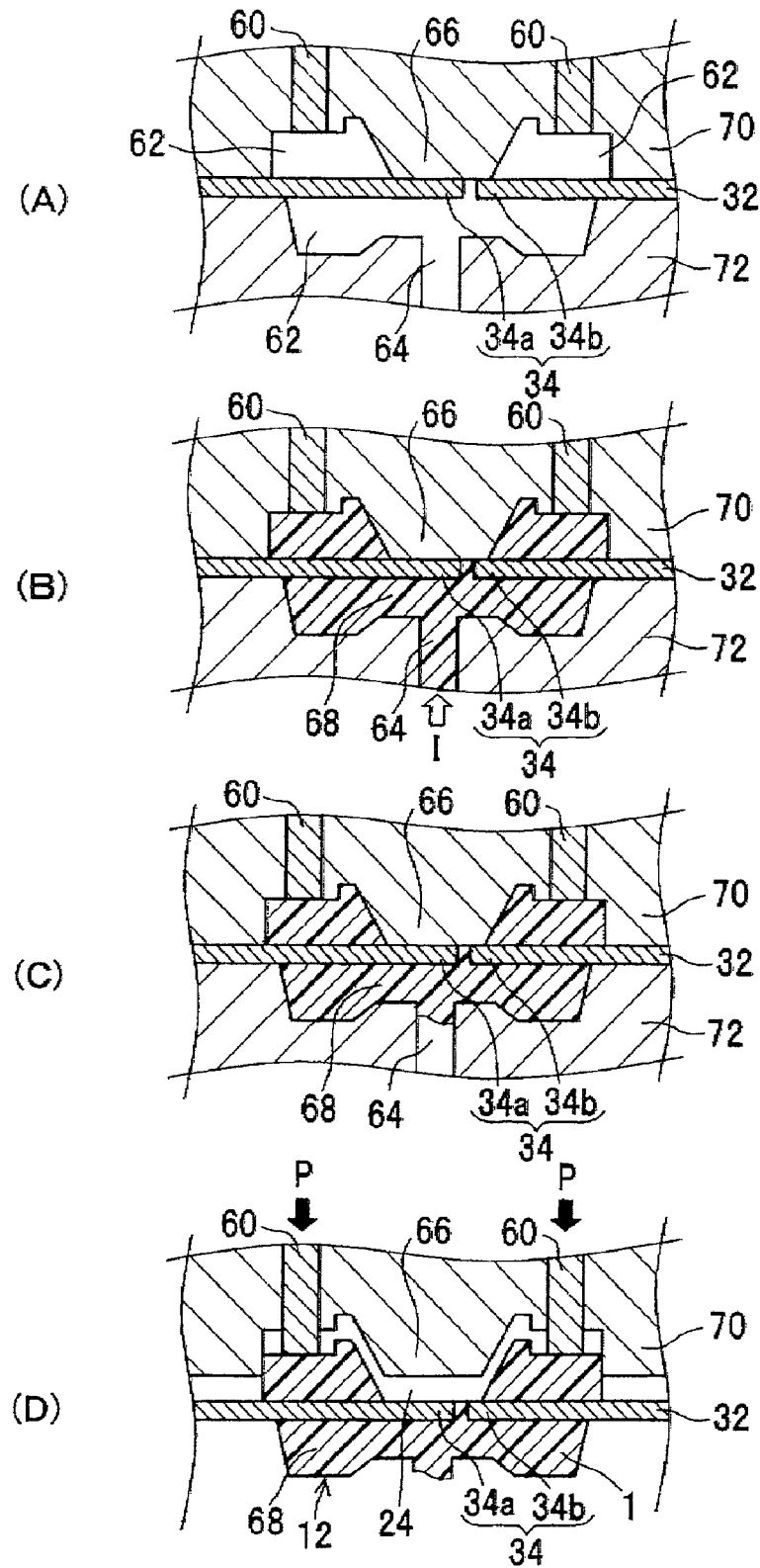
FIG. 5 is a sectional view schematically showing a process of manufacturing the lead frame provided with the housing according to the present invention.
Figure 6:
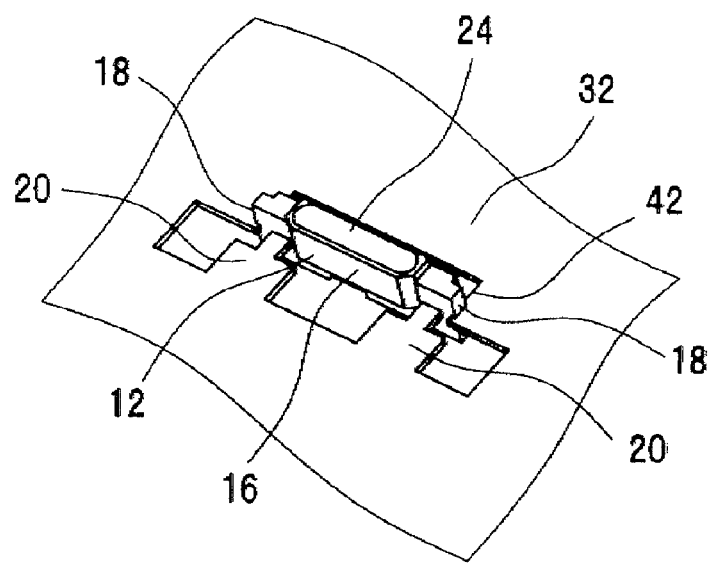
FIG. 6(A) is a perspective view schematically showing the lead frame provided with the housing according to the present invention.
FIG. 6(B) is a partially enlarged view of a housing support structure of (A).
Figure 6:
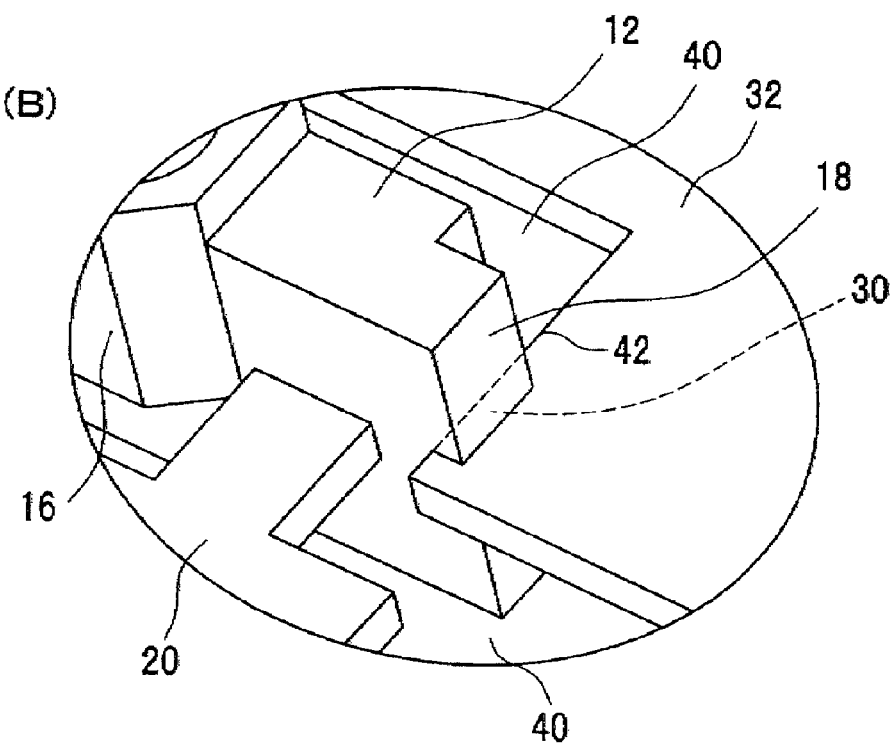

Through the series of steps shown in FIG. 5, the lead frame 32 provided with the housing 12 shown in FIG. 6 is obtained. A part of the circumference 42 of the opening 40 formed in the lead frame 32 cuts into the side surfaces 18 of the housing 12 which has been molded, so that the penetrating groove 30 is formed. The groove 30 enables the housing 12 to be supported on the lead frame 32 throughout the manufacturing process of the light emitting device 10. The housing 12 has, on the circumferential surface thereof, a thin linear ridge-like protrusion called the parting line formed along the border of the upper and lower molding dies.

When the housing is molded by disposing the dies as shown in FIG. 5, the parting line of the housing 12 thus molded and the groove 30 are located substantially in the same plane.

Figure 7:
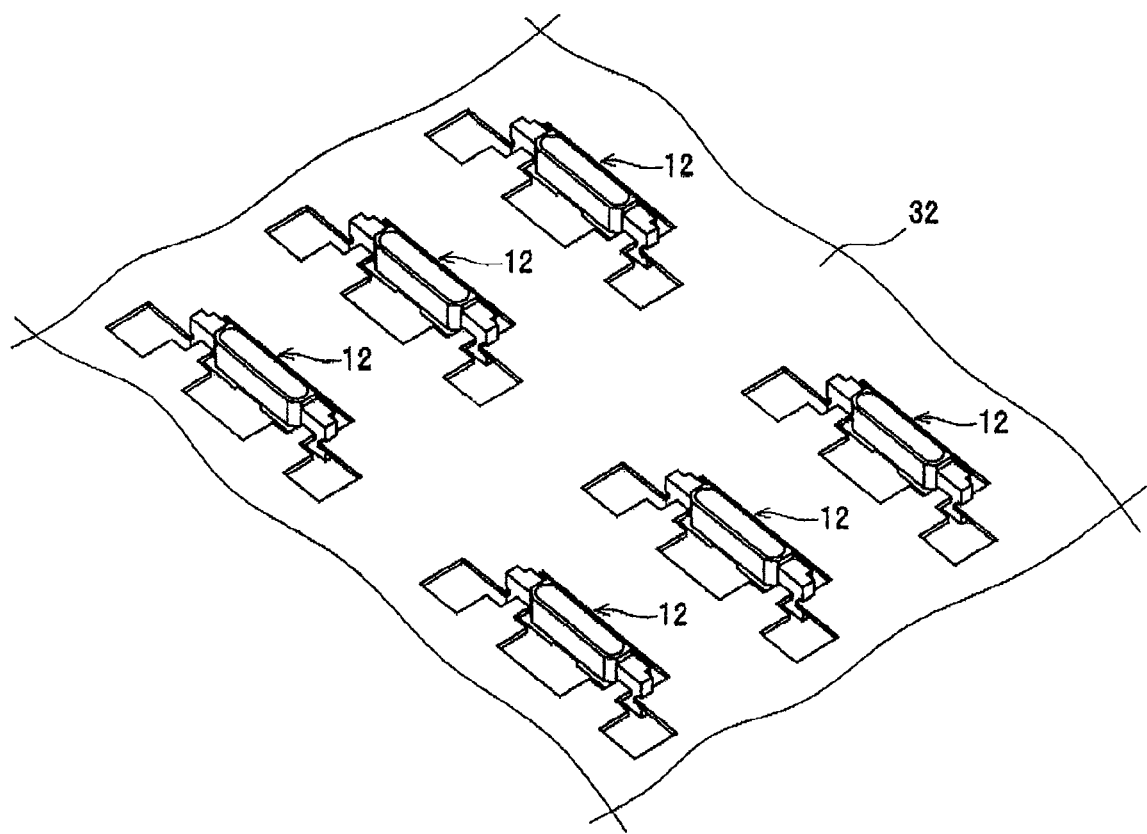
FIG. 7 is a perspective view schematically showing the lead frame provided with the housing of the present invention.

While a single housing 12 is formed in the case shown in FIG. 6, typically a number (3 in column by 2 in row, totaling 6 in the case shown) of the housings 12, 12 . . . are formed in one lead frame 32 as shown in FIG. 7. When a number of housings 12 are formed, all the housings 12 can be formed at the same time by using the molding dies 70, 72 which have a number of cavities 62 for the housings and pouring the molding material into the cavities 62 at the same time.

In FIGS. 6 and 7, the process of forming the light emitting device 10 by using the lead frame 32 provided with the housing 12 will now be described with reference to FIG. 8 and FIG. 9.

First, the inside of the recess 24 of the housing 12 will be described below with reference to FIG. 8.

The housing 12 has a pair of lead electrodes 20 (20a and 20b) which penetrate from the bottom surface 16 of the housing 12 to the recess 24. Exposed on the inside of the recess 24 are the pair of distal ends 34 of the lead electrodes 20 (34a, 34b) which oppose each other. As described above, the housing 12 is supported on the lead frame 32 by the circumference 42 of the opening 40 formed in the lead frame 32 and the lead electrodes 20.

It is preferable to form the recess 24 of the housing 12 in such a shape that makes it easier for the light emitted by the semiconductor light emitting element 36 mounted on the inside of the recess 24 to emerge on the side of the light emitting surface 14 of the housing 12. For example, a tapered shape which gradually expands toward the light emitting surface 14 is preferably used.

A procedure of securing the semiconductor light emitting element 36 on the housing 12 will now be described.

The semiconductor light emitting element 36 is die-bonded onto the distal end 34a of the lead electrode 20a in the recess 24 of the housing 12, then the positive electrode and the negative electrode of the semiconductor light emitting element 36 are connected to the distal ends 34a, 34b of the lead electrodes 20a, 20b, respectively, by wire bonding with the metal wire 38. The semiconductor light emitting element 36 may be selected from light emitting diodes which emit light of various wavelengths. In order to constitute a surface emission light source for white light in combination with an optical guide, in particular, a nitride semiconductor light emitting element which emits blue light and a fluorescent material which absorbs blue light and emits yellow light may be preferably combined.

Then recess 24 of the housing 12 is sealed with the translucent resin 26 for the protection of the semiconductor light emitting element 36 from the environment. The recess 24 of the housing 12 is filled with the translucent resin 26 so as to cover the semiconductor light emitting element 36 or the metal wire 38, and the resin is hardened.

Figure 8:
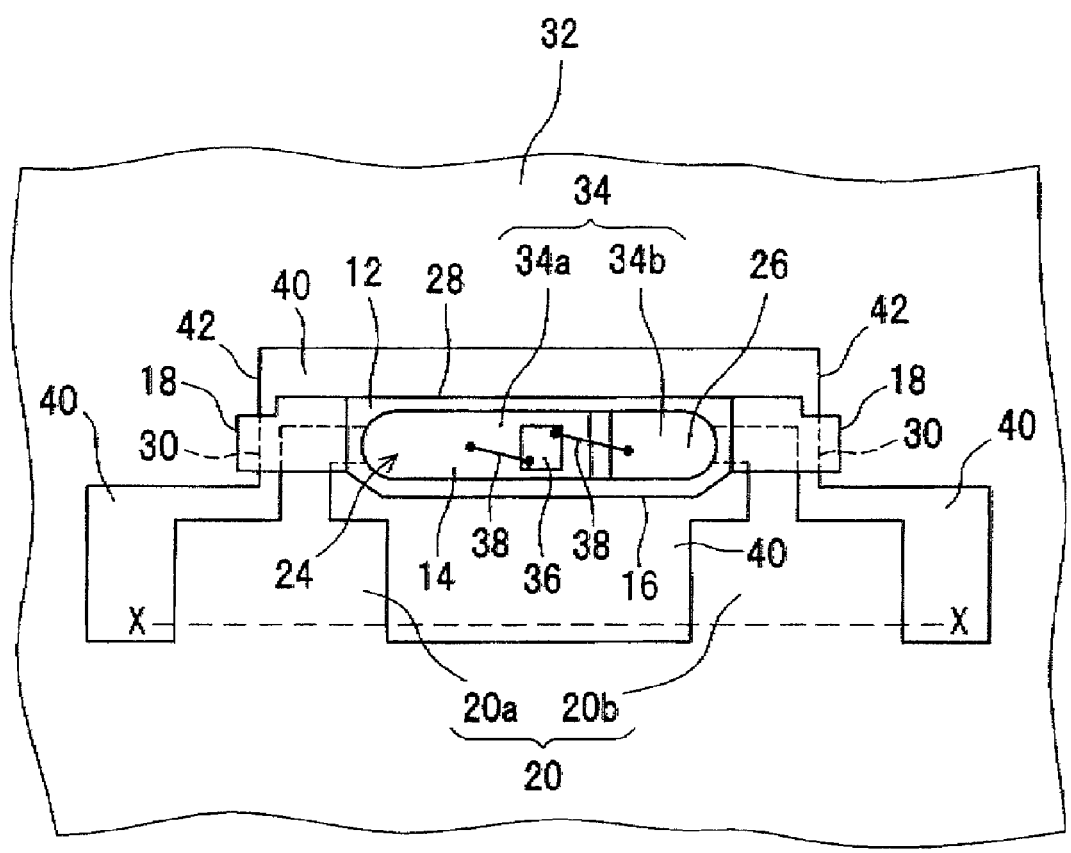
FIG. 8 is a top view schematically showing the lead frame provided with the housing of the present invention.
Figure 9:
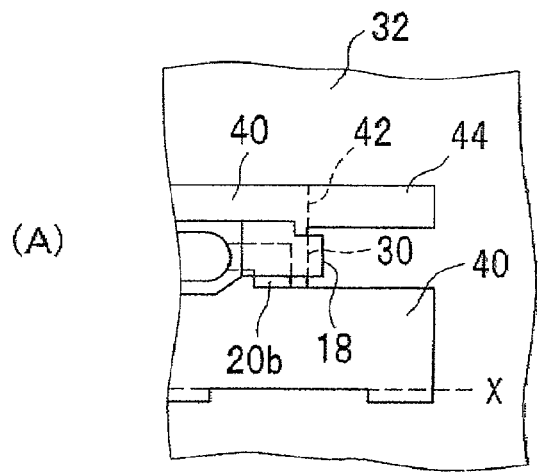
FIG. 9 is a top view schematically showing a method for decreasing the strength of the lead frame when removing the light emitting device of the present invention from the lead frame.
Figure 9:
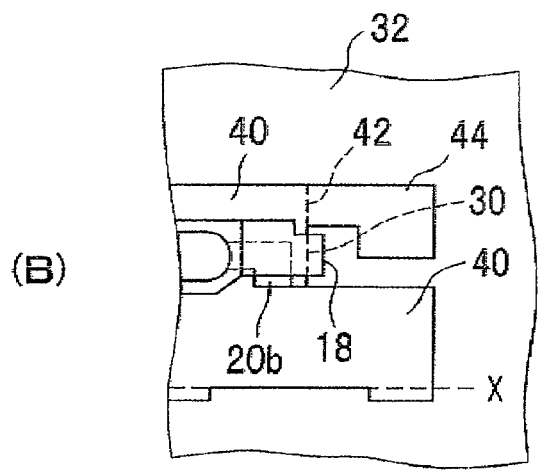
Figure 9:
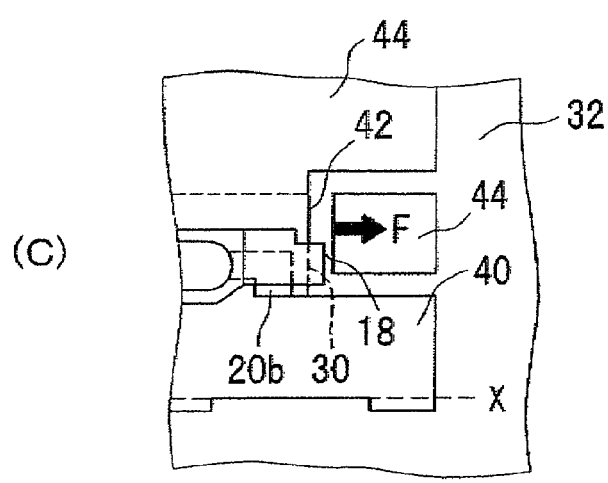

Then the lead electrodes 20 are cut off from the lead frame 32 at the position indicated by dashed line X in FIG. 8 and are bent along the external wall surface of the housing 12 (called the cut-forming process) thereby to form the connection terminals of J-bend shape. Since the side surfaces 18 of the housing 12 are secured onto a part of the circumference 42 of the opening 40 formed in the lead frame 32, the lead electrodes 20 can be bent at the same time for the plurality of housings 12 formed on one lead frame 32, thus improving the efficiency of manufacturing the light emitting device 10. Particularly, according to the present invention, since the housing 12 is supported by the circumference 42 of the opening 40 which has a high strength, the housing 12 can be held in the predetermined posture even when the bending operation applies a stress to the housing 12.

Bending operation of the lead electrodes 20 is carried out by bending the narrow portion of the lead electrode 20 either toward the light emitting surface 14 or toward the back surface 22. Then a portion of the wider portion of the lead electrode 20, which extends beyond the side surface 18 of the housing 12, is bent along the side surface 18.

The narrow portion of the lead electrode 20 is preferably bent toward the back surface 22 as in the light emitting surface 14 shown in FIG. 1, for roughly two reasons described below.

The first reason is the effect of suppressing solder or eutectic layer from spreading onto the light emitting surface 14 when mounting the light emitting device 10. In the light emitting device 10 of the present invention, the bottom surface 16 is used as a mounting surface and the lead electrode 20 is electrically connected to the circuit board by means of solder or eutectic layer. Therefore, when the lead electrode 20 is bent toward the light emitting surface 14, solder bump or eutectic layer is located near the light emitting surface 14. Thus in case the accuracy of mounting is not proper and too much solder or molten eutectic metal is applied, the solder or eutectic metal may spread onto the light emitting surface 14. When the lead electrode 20 is bent toward the back surface 22, the light emitting device 10 which has been mounted is less likely to be adversely affected and the rate of defect occurrence can be decreased.

The second reason is the heat dissipation from the light emitting device 10. The housing 12 has smaller thickness in a portion where the lead electrodes 20 are disposed, thus keeping the thickness of the light emitting device 10 from increasing due to the addition of the lead electrode 20. While heat dissipation from the light emitting device 10 can be improved by increasing the surface area of the lead electrode 20, it requires it to increase the area of the portion of the housing where the thickness is made smaller. When the lead electrode 20 is bent toward the light emitting surface 14, since the area of the portion of the housing where the thickness is made smaller is restricted by the opening of the window of light emission, it is difficult to increase the surface area of the lead electrode 20. When the lead electrode 20 is bent toward the back surface 22, in contrast, limitation on the surface area of the portion of the housing of smaller thickness is eliminated. Accordingly, surface area of the lead electrode 20 can be increased as long as the pair of lead electrodes 20 are prevented from touching each other, thereby improving the heat dissipation.

Figure 10:
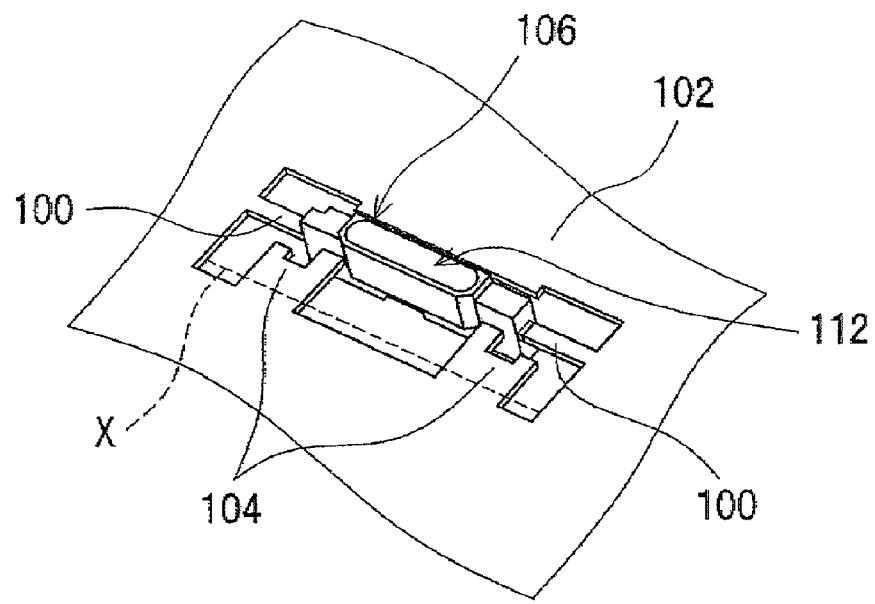
FIG. 10(A) is a perspective view schematically showing a lead frame provided with the hanger lead of the prior art.
FIG. 10(B) is a partially enlarged view of a housing support structure of (A).
Figure 10:
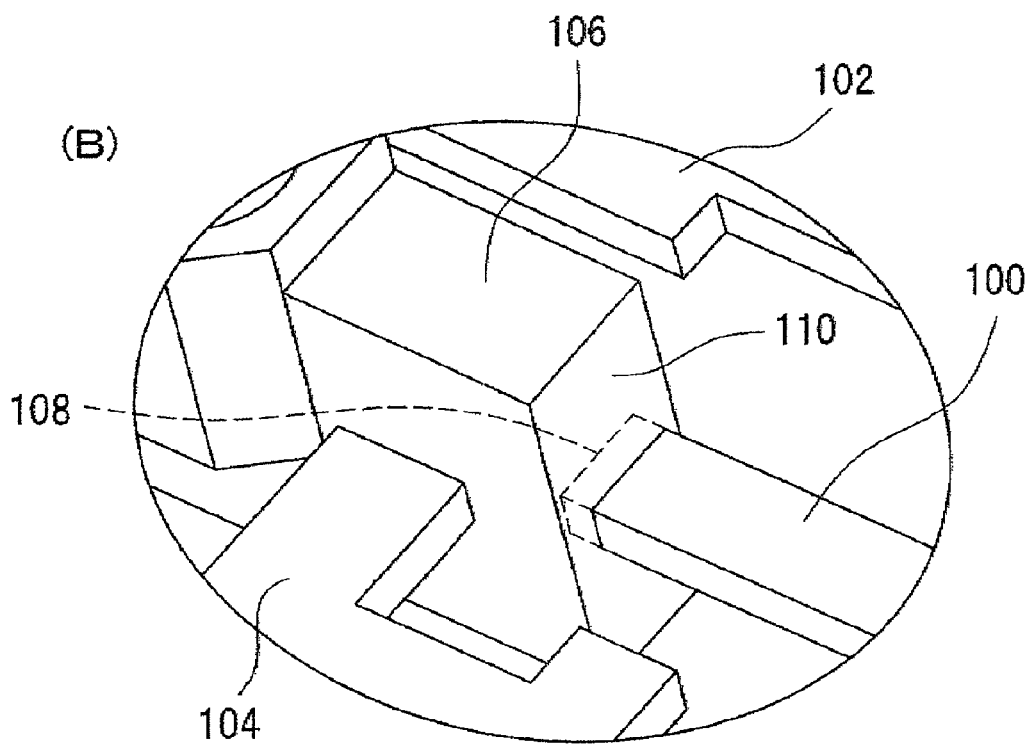
Figure 11:
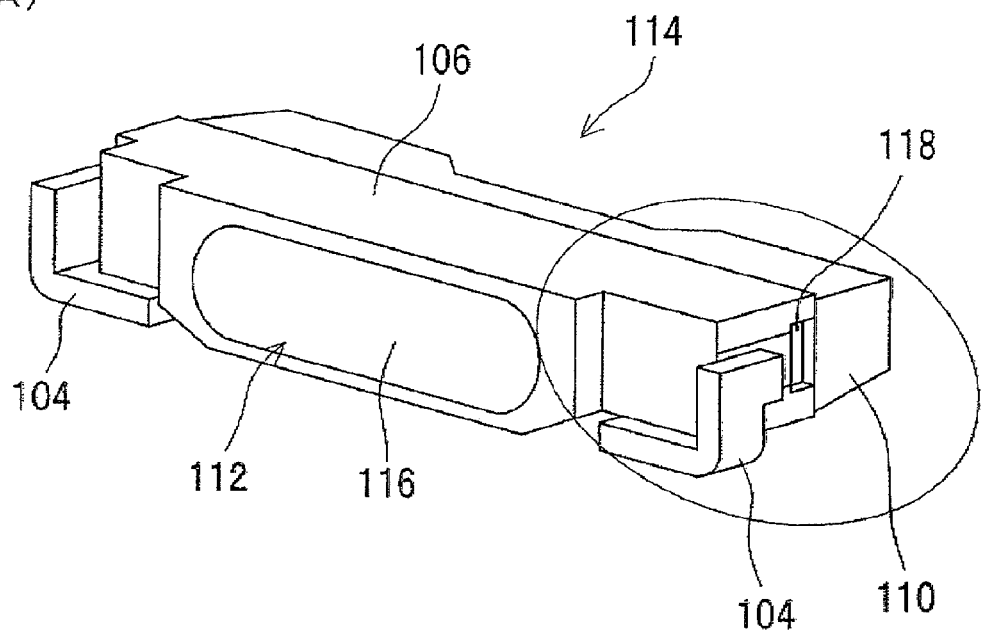
FIG. 11(A) is a perspective view showing the light emitting device of the prior art.
FIG. 11(B) is a partially enlarged view of a side surface of (A).
Figure 11:
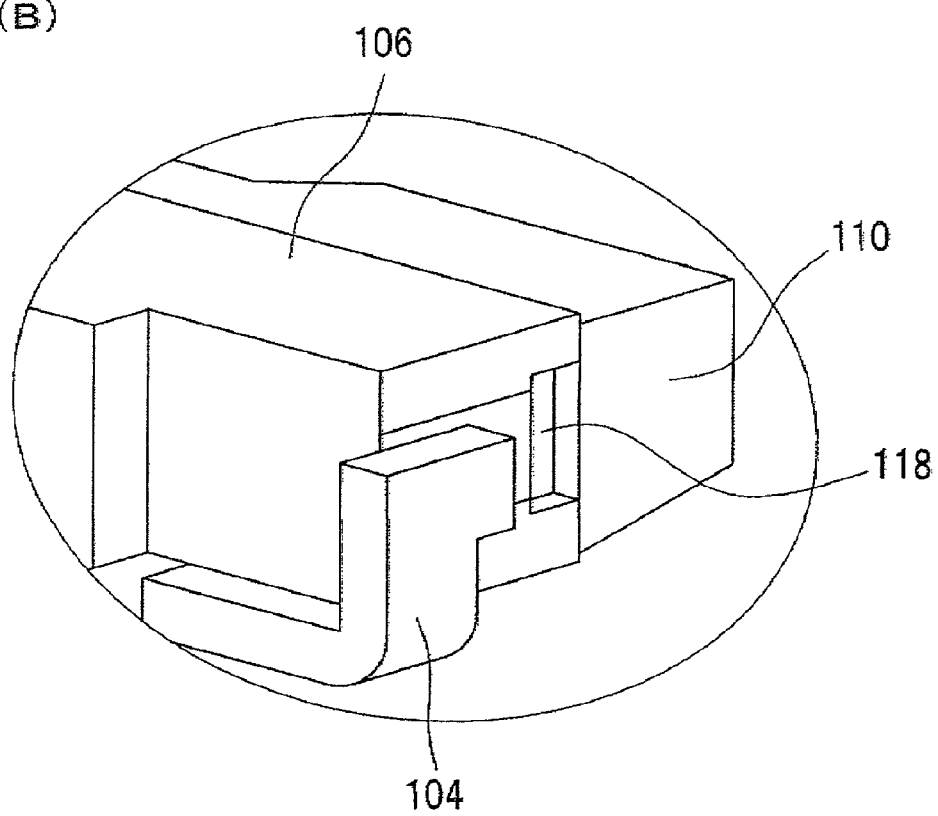

When the lead electrodes 20 have been bent, the housing 12 is removed from the lead frame 32. In the case of the housing supported by the hanger lead of the prior art (refer to FIG. 10), the hanger lead 100 which is formed in a band shape has low strength and can be easily bent. However, the circumference 42 of the opening 40 formed in the lead frame 32 whereon the housing 12 is supported in the present invention has a high strength and cannot be directly bent. Accordingly, in the present invention, strength of the circumference 42 of the opening 40 is decreased by cutting out the portion near the circumference 42 before removing the housing 12. FIG. 9 shows an example of the cutting out operation.

In FIG. 9(A) and FIG. 9(B), the circumference 42 of the opening 40 which support the housing 12 is left to remain in a band or L shape after forming a cutout 44 of the lead frame 32. By cutting out in this way, the circumference 42 of the opening 40 is formed in a configuration similar to that of the hanger lead 100 shown in FIG. 10, and can be easily bent.

As another form, the circumference 42 of the opening 40 may be left in the shape of rectangular opening as shown in FIG. 9(C). In this form, the housing 12 may be removed by pulling the circumference 42 in the direction indicated by the arrow, thereby easily deforming the circumference 42.

The light emitting device 10 made as described above is prone to less defects which would be caused by the reduction in thickness and weight, and can be handled easily during the manufacturing process and mounting on the sub-mount.

Components of the light emitting device 10 will now be described in detail.

(Lead Electrode 20)

While there is no restriction on the material used to form the lead electrode 20 as long as it has electrical conductivity, it is preferable to use iron, steel, copper-clad iron, copper-clad tin, copper, gold, silver-plated aluminum, iron, copper or the like.

(Housing 12)

The housing 12 may be formed from a thermoplastic resin such as liquid crystal polymer, polyphthalamide resin or polybutylene phthalate (PBT). It is particularly preferable to use a semi-crystalline polymer resin which includes crystal having a high melting point such as polyphthalamide resin, for the reason of high surface energy and good bonding with the translucent resin 26 which fills in the recess of the housing 12. Use of this material suppresses the housing and the translucent resin 26 from being separated along the interface therebetween when the translucent resin 26 is cooled so as to harden. A white pigment such as titanium oxide may be added to the molding material so that the housing 12 can efficiently reflect the light emitted by the semiconductor light emitting element 36.

(Metal Wire 38)

The metal wire 38 used in wire bonding may be made of, for example, a metal such as gold, copper, platinum or aluminum or an alloy thereof.

(Translucent Resin 26)

The translucent resin 26 is preferably one that has high weatherability such as silicone resin, epoxy resin, urea resin, fluorocarbon resin or a hybrid resin which includes at least one of the former. Instead of the translucent resin 26, an inorganic material having light fastness such as glass or silica gel.

In case a blue light emitting diode and a fluorescent material are combined to make the light emitting device 10 which emits white light, particles of the fluorescent material may be dispersed in the translucent resin 26. For the fluorescent material, a rare earth-based fluorescent material which absorbs blue light and emits yellow light (for example, YAG fluorescent material) is preferably used.

The semiconductor device of the present invention can be used in a device which requires an extremely thin light emitting device such as the backlight of a liquid crystal display.

What is claimed is:

1. A method for manufacturing a semiconductor device which comprises a housing which has a recess in the front surface thereof, a pair of lead electrodes which have distal ends exposed in the recess, protrude from the external surface of the housing, and are bent along the bottom surface of the housing, and a semiconductor element which is housed in the recess and is electrically connected to the pair of lead electrodes, the method comprising the steps of:
    preparing the lead frame made from a metal sheet having a plurality of openings and a pattern of lead electrodes formed therein so as to protrude toward the inside of each of the openings;
    forming the housing in each opening of the lead frame so as to expose the distal ends of the lead electrodes in the recess of the housing and form grooves in the side surfaces of the housing by means of the circumference of the opening;
    cutting off the pair of lead electrodes from the lead frame which protrude from the housing and bending the pair of lead electrodes along the external wall surface of the housing while holding the housing on the lead frame by fitting the circumference of the opening into the groove; and
    releasing the housing from the lead frame.

2. The method for manufacturing a semiconductor device according to claim 1, wherein notches or steps are formed in the corners where the top surface and the pair of side surfaces of the housing intersect, in the step of forming the housing.

3. The method for manufacturing the semiconductor device according to claim 1, wherein the notch or the steps are formed in the corners where the bottom surface and the pair of side surfaces of the housing intersect, in the step of forming the housing.

4. The method for manufacturing the semiconductor device according to claim 1, further comprising the step of die-bonding the semiconductor element onto the distal end of the lead electrode exposed in the recess of the housing.

5. The method for manufacturing the semiconductor device according to claim 1, further comprising the step of filling the recess of the housing with a translucent resin before the step of cutting off the pair of lead electrodes from the lead frame.

6. The method for manufacturing the semiconductor device according to claim 1, wherein the pair of lead electrodes are bent toward a back surface of the semiconductor device in the step of bending the pair of lead electrodes.

7. The method for manufacturing the semiconductor device according to claim 1, wherein a portion near the circumference of the opening is cut out before the step of releasing the housing.

8. The method for manufacturing the semiconductor device according to claim 1, the circumference of the opening is cut out before the step of releasing the housing so that a portion of the circumference supporting the housing remains in a band or L shape.

9. The method for manufacturing the semiconductor device according to claim 1, the circumference of the opening is cut out before the step of releasing the housing so that the circumference remain in the shape of a rectangular opening.

10. A method for manufacturing a housing support structure which comprises a housing having a recess in the front surface thereof, a pair of lead electrodes which have distal ends exposed in the recess, penetrate through the housing and protrude from the external surface of the housing, and a lead frame which supports the pair of lead electrodes at predetermined positions, the method comprising the steps of:
    preparing the lead frame made from a metal sheet having a plurality of openings and a pattern of the lead electrodes formed therein so as to protrude toward the inside of each of the openings; and
    forming the housing in each opening of the lead frame so as to expose the lead electrodes in the recess of the housing and form grooves in the side surface of the housing by means of the circumference of the opening.

11. The method for manufacturing a semiconductor device according to claim 10, wherein notches or steps are formed in the corners where the top surface and the pair of side surfaces of the housing intersect, in the step of forming the housing.

12. The method for manufacturing the semiconductor device according to claim 10, wherein the notch or the steps are formed in the corners where the bottom surface and the pair of side surfaces of the housing intersect, in the step of forming the housing.

13. A method of manufacturing a housing support structure which comprises a housing having a recess in the front surface thereof, a pair of lead electrodes which have distal ends exposed in the recess, penetrate through the housing and protrude from the external surface of the housing, and a lead frame which supports the pair of lead electrodes at predetermined positions, the method comprising the steps of:
    preparing the lead frame made from a metal sheet having a plurality of openings and pattern of the lead electrodes formed therein so as to protrude toward the inside of each of the openings; and
    forming the housing in each opening of the lead frame so as to expose the lead electrodes in the recess of the housing and secure the housing in two directions onto a part of the circumference of the opening formed in the lead frame.

14. The method for manufacturing a semiconductor device according to claim 13, wherein notches or steps are formed in the corners where the top surface and the pair of side surfaces of the housing intersect, in the step of forming the housing.

15. The method for manufacturing the semiconductor device according to claim 13, wherein the notch or the steps are formed in the corners where the bottom surface and the pair of side surfaces of the housing intersect, in the step of forming the housing.

\* \* \* \* \*